(12) United States Patent
Ward et al.

(10) Patent No.: US 7,087,923 B2
(45) Date of Patent: Aug. 8, 2006

(54) PHOTON SOURCE AND A METHOD OF FABRICATING A PHOTON SOURCE

(75) Inventors: Martin Brian Ward, Cambridge (GB); Andrew James Shields, Cambridge (GB)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/860,484

(22) Filed: Jun. 4, 2004

(65) Prior Publication Data

US 2005/0161660 A1    Jul. 28, 2005

(30) Foreign Application Priority Data

Jun. 24, 2003    (GB) .................................. 0314771.7

(51) Int. Cl.
*H01L 29/06*    (2006.01)
(52) U.S. Cl. ............................ 257/22; 257/14; 257/12; 257/9; 257/E29.071
(58) Field of Classification Search ...................... None
See application file for complete search history.

(56) References Cited

U.S. PATENT DOCUMENTS

2002/0196827 A1* 12/2002 Shields et al. ................ 372/45

2003/0127608 A1*  7/2003 Shields et al. ........... 250/493.1

FOREIGN PATENT DOCUMENTS

| GB | 2 367 690 A | 4/2002 |
| GB | 2 380 605 A | 4/2003 |
| WO | WO 01/93384 A1 | 12/2001 |

OTHER PUBLICATIONS

S. Anders., et al., "Bimodal Size Distribution of Self-Assembled $In_xGa_{1-x}As$ Quantum Dots", Physical Review B 66, 125309, 2002, pp. 125309-1-125309-5.

* cited by examiner

*Primary Examiner*—Leonardo Andujar
*Assistant Examiner*—Scott R. Wilson
(74) *Attorney, Agent, or Firm*—Oblon, Spivak, McClelland, Maier & Neustadt, P.C.

(57) ABSTRACT

A photon source comprising a quantum dot layer having a plurality of quantum dots with an n-modal distribution in emission wavelength, said n-modal distribution in emission wavelength comprising n peaks in a plot of dot density as a function of emission wavelength where n is an integer of at least 2, the photon source further comprising isolating means for isolating the emission from a predetermined number of quantum dots.

23 Claims, 6 Drawing Sheets

PHOTON SOURCE AND A METHOD OF FABRICATING A PHOTON SOURCE

BACKGROUND OF THE INVENTION

The present invention is concerned with the field of photon sources and methods for fabricating photon sources. In particular, the present invention is concerned with photon sources which may be configured as single photon sources whose output may be controlled to the accuracy of a single photon.

Recently, there has been considerable interest in developing photon sources which can be configured as single photon sources for use in quantum cryptography for distributing a quantum key and other quantum information processing systems. Further, potential applications also exist in low-noise and low-signal metrology.

A photon source, which may be used for these types of application, has previously been described in GB 2 367 690. This patent application describes both optically excited single photon sources and electrically excited single photon sources. Although the initial results for these types of photon sources are extremely positive, in order to develop a source optimised for use with standard telecom optical fibres, the emission wavelength should lie close to 1.3 µm or 1.55 µm.

Quantum dots which emit at the required energy or wavelength can be fabricated from InAs or InGaAs using a self assembled growth technique. Here, the quantum dot layer is formed on an underlying layer which has a mismatched lattice constant to that of the material of the quantum dots when unstrained.

WO01/93384 describes a single photon emitter having a plurality of quantum dots located in a cavity. The dots have a distribution of sizes and hence emission frequencies centred around a central emission frequency with the largest concentration of dots. The cavity is designed to couple to dots with frequencies other than the central emission frequency.

Anders et al, Physical Review B 66 125309 (2002) describes observing a bimodal distribution in the size of InGaAs quantum dots formed at a lattice mismatched interface. An InGaAs layer deposited upon a GaAs substrate forms quantum dots with two distinctly different average sizes and thus produces two distinct peaks in the emission spectrum. The emission wavelength distribution thus consists of two peaks: a first lower wavelength peak; and a second longer wavelength peak.

BRIEF SUMMARY OF THE INVENTION

The inventors have realized that this n-modal distribution in the emission spectrum of the quantum dot layer is particularly advantageous for photon sources and especially single photon sources. By carefully controlling the growth conditions and duration, they have found it is possible to prepare a distribution with a low areal density of quantum dots in one of the peaks of the n-modal distribution. Thus, by tailoring the deposition it is possible to produce dots with both the desired emission wavelength and areal density.

Thus, in a first aspect, the present invention provides a photon source comprising a quantum dot layer having a plurality of quantum dots with an n-modal distribution in emission wavelength, said n-modal distribution in emission wavelength comprising n peaks in a plot of dot density as a function of emission wavelength where n is an integer of at least 2, the photon source further comprising isolating means for isolating the emission from a predetermined number of quantum dots.

For a single photon source, said predetermined number is 1.

Generally, the isolating means is configured to isolate emission from dots contributing to one of the wavelength peaks. For example, in a bimodal distribution, the dots would be selected from the second, longer wavelength peak. The growth conditions and duration of growth of the layer is controlled so that there is a relatively low density of quantum dots, for example less than $4 \times 10^8$ dots per $cm^2$, with the desired emission wavelength.

For a single photon source, it is desirable to form a relatively low density of quantum dots with the desired wavelength. Since an n-modal distribution will contain many peaks and troughs, it is desirable to select dots which have the desired emission wavelength and which are present in a relatively low density. This may be achieved through careful control of the structure, growth conditions and duration. The growth of the strained layer comprising the dots proceeds initially with the formation of a very thin highly strained, patchy, two-dimensional layer called the wetting layer. Beyond a first critical growth duration, quantum dots form on the wetting layer which have an emission wavelength lying within a first peak in the emission wavelength distribution. As the growth proceeds the number of dots emitting in the first peak of the emission wavelength distribution increases and their average emission wavelength increases. After a second critical growth duration, larger dots start to form which have an emission wavelength lying within the second peak in the emission wavelength distribution. Further deposition of the quantum dot material increases the number of quantum dots within the second peak in the emission wavelength distribution. By terminating the growth of the quantum dot layer just after the larger, longer wavelength dots start to form, a low areal density of the longer wavelength dots can be prepared.

In a preferred embodiment, dots with the desired emission energy will have an areal density of between $10^6$ to $10^9$ $cm^{-2}$.

Preferably, n=2 such that the distribution is a bimodal distribution.

In a particularly preferred embodiment, the isolating means are configured to isolate emission from dots with a predetermined emission wavelength or wavelength band. Thus, the isolating means may be a bandpass wavelength filter, or alternatively a filter designed to pass only longer wavelengths. Using this filter, it is possible to select dots of the desired wavelength and providing that the emission wavelength distribution is correctly configured, these dots may have a relatively low areal density.

Preferably, the isolation means are configured to isolate the output from dots with an emission wavelength close to 1.3 µm or 1.55 µm.

The isolation means may also be provided by defining an emissive area of the source, wherein only dots within the emissive area contribute to the output of the source. Said emissive area may be defined by patterning the dot layer such that only dots within the emission area contribute to the output, patterning a further layer in the source such that output from dots outside the emissive area is blocked and patterning a further layer within the source such that only dots within the emissive area are excited to emit photons. Alternatively, the emissive area may be defined by external optics which only allow the output of quantum dots within the emissive area to be collected.

The emissive area may also be provided in combination with a filter such that the emissive area decreases the number of dots contributing to the output of the photon source and the filter selects the output from certain dots within the emissive area.

Preferably, the emissive area is less than $10^{-10}$ m², more preferably less than $10^{-12}$ m²

The quantum dots may be provided within a quantum well.

The source preferably comprises a base layer. The base layer is the layer which sets the lattice constant for the photon source. Generally, the base layer will be the substrate of the source or other layer which fulfils this function. The material from which the dot layer is formed preferably has a different lattice constant, when the dot layer is unstrained, to that of the base layer.

The photon source may also preferably comprise a strain relaxing layer having a different lattice constant to that of the dot layer and the base layer. The strain relaxing layer will have a lattice constant which is between that of the lattice constant of the dot layer and the base layer. The strain relaxing layer will preferably be provided adjacent the dot layer. The strain relaxing layer may be a layer above or below the quantum dot layer. Alternatively a strain relaxing layer may be provided both below and above the quantum dot layer.

The photon source may be an optically excited photon source or an electrically excited photon source or any of the photon sources described in GB 2 367 690.

If the photon source is an electrically driven photon source, the source will comprise electrical supply means to electrically supply carriers to the quantum dots. The electrical supply means may be configured to supply carriers to a predetermined number of quantum dots. For example, the electrical supply means may be configured only to supply carriers to quantum dots in a small area or may be configured to resonantly eject carriers into quantum dots, with a carrier energy level within a certain narrow band.

Alternatively, the photon source may be an optically pumped photon source, and thus, the source would comprise a further radiation source, for example, a laser, configured to excite carriers within said quantum dots. The laser source may excite the carriers directly into the quantum dots, or it may excite carriers substantially in the layers surrounding the quantum dots, from where they can be captured into the quantum dots. The former may be achieved by tuning the laser energy to be resonant with an absorption resonance (either the ground state transition or a higher energy transition) of the quantum dot. The latter may be achieved by using a laser with an energy above the bandgap of the surrounding material. In this case the excitation is non-resonant with the quantum dot transitions.

In a particularly preferred embodiment, the source comprises at least one barrier layer to the quantum dot layer, said barrier layer being configured such that there is a difference of at least 0.1 eV in the conduction and valence bands between the dot layer and the at least one barrier layer. Preferably the barrier height in both the conduction and valence bands exceeds 0.3 eV. More preferably it exceeds 0.5 eV. This helps to suppress thermal excitation of electrons and holes out of the quantum dots. For example, if the quantum dots are InAs or $In_xGa_{1-x}As$, the barrier layers may be chosen to be AlAs or $Al_yGa_{1-y}As$.

The quantum dot layer is preferably provided within a cavity. The cavity may be configured to couple to the desired emission wavelength into the collection optic or fibre and thus act as a filter.

In a second aspect, the present invention provides a method of fabricating a photon source, the method comprising:

forming a base layer having a first lattice constant;

forming a layer of quantum dots by depositing material having a different lattice constant to said base layer when the layers are unstrained, said material being deposited until the dots formed have an n-modal population distribution with respect to emission wavelength, said n-modal distribution in emission wavelength comprises n-peaks in a plot of dot density as a function of emission wavelength, where n is an integer of at least two.

A further layer is preferably provided overlying the dot layer.

Preferably, the amount of material deposited in the dot layer is controlled to be just greater than the critical amount required for dots to form in the second peak of the emission wavelength distribution. This may be achieved by controlling the duration of the growth of the quantum dot layer.

The amount of material deposited in the said dot layer may be calibrated by making a plurality of test samples. For example, each test sample may be grown using the same growth temperature and flux rates but the growth duration of the quantum dot layer may be varied between the samples. Using suitable microstructural or optical analysis, a plot of the density of dots against dot emission wavelength or dot size for each sample may be produced. The growth conditions for a device which provides dots at the required wavelength and density may then be determined.

Samples where the growth rate and temperature have been varied may also be measured as described above to determine the optimum conditions for the growth of dots with the desired wavelength.

Preferably, the dots are formed by depositing InAs or $In_xGa_{1-x}As$. Preferably the base layer for the structure is GaAs.

BRIEF DESCRIPTION OF THE DRAWINGS

The present invention will now be described with reference to following preferred non limiting embodiments in which.

DETAILED DESCRIPTION OF THE INVENTION

Figure 1:
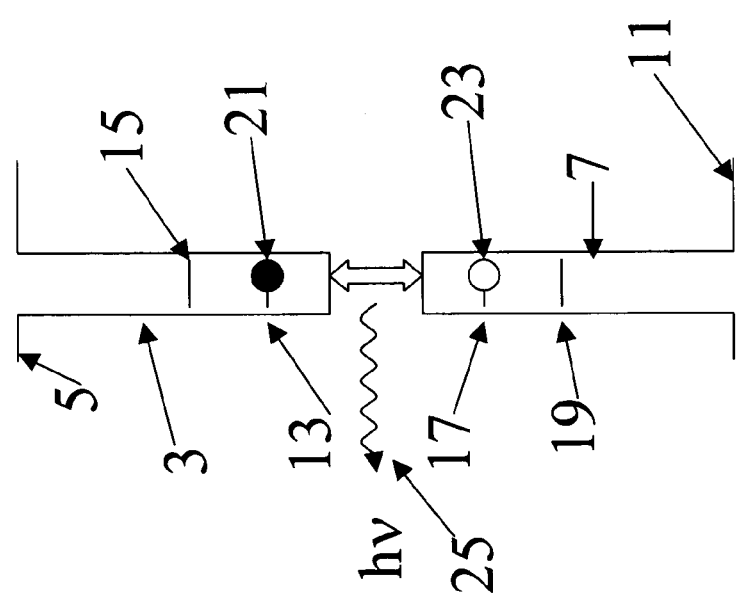
FIG. 1 schematically illustrates the conduction band and valance band of a quantum dot.

FIG. 1 illustrates a schematic band structure of a quantum dot 1. The quantum dot 1 comprises a confining potential 3 formed in conduction band 5 and a corresponding confining potential 7 formed in valance band 11. First 13 and second 15 confined conduction band levels are formed in confining potential 3. First 17 and second 19 confined valance band levels are formed in valance band 11.

If an electron 21 is present in the conduction band 5 and a hole 23 is present in the valance band 11, these carriers 21, 23 may combine to emit a photon 25 with a predetermined energy.

This recombination process may be used to fabricate a photon source or a single photon source. The carriers 21 and 23 may be supplied to the conduction band 5 and valance band 11 via electrical excitation or optical excitation.

Photon emitters operating using this principle are described with reference to GB 2 367 690. By isolating the output from a single quantum dot, it is possible to produce a single photon source or photon pair source. The emission from a finite number of quantum dots, can be used to produce an N-photon source, where N is an integer.

Figure 2:
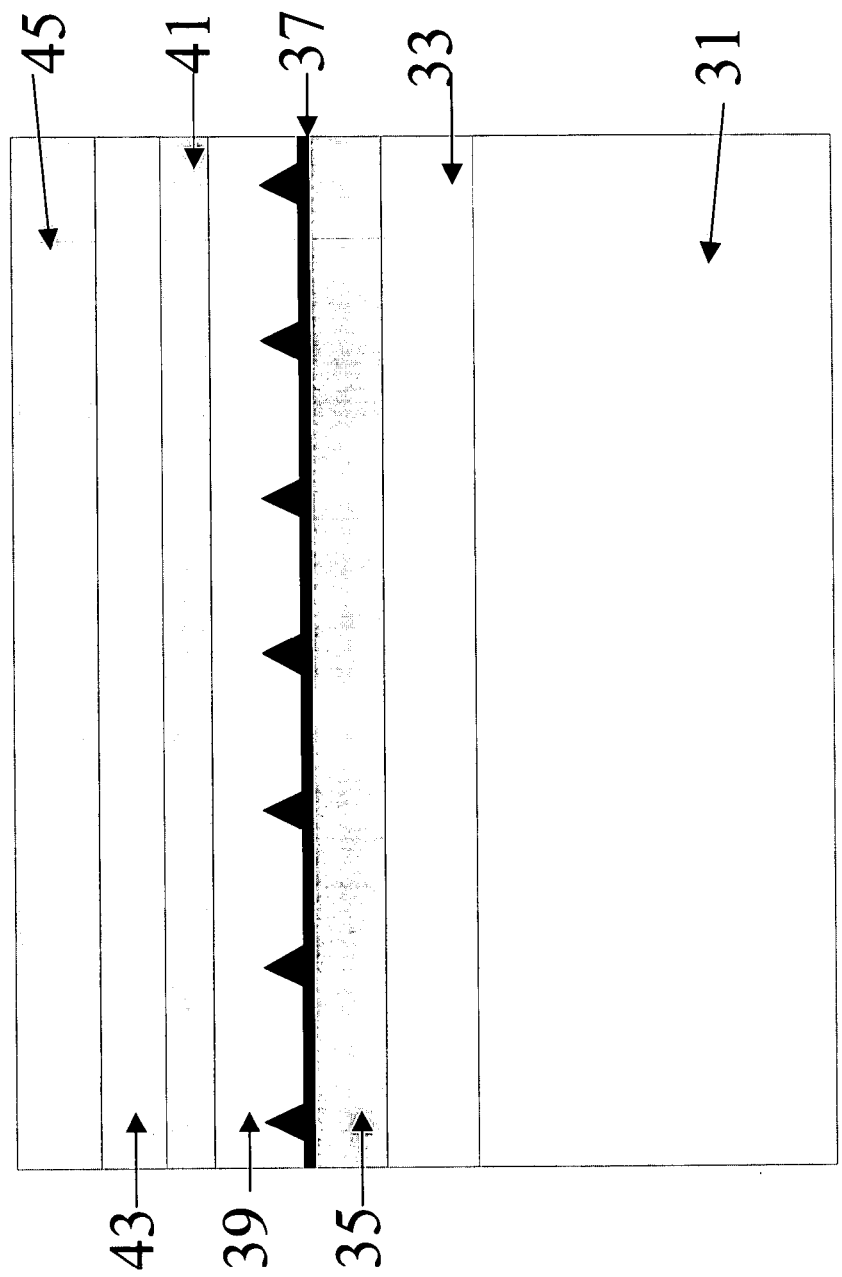
FIG. 2 schematically illustrates a layer structure for an electrically driven photon source.

FIG. 2 schematically illustrates a typical layer structure for a photon source which can be prepared by molecular beam epitaxy. The source comprises a substrate 31 which is formed from semi-insulating GaAs (100). A p-type contact layer 33 is formed overlying and in contact with said substrate 31. Said p-type contact layer 31 comprises 500 nm of GaAs doped with Be $5\times10^{18}$ cm$^{-3}$.

An undoped underlying layer 35 is then formed overlying p-type layer 33. Said underlying layer 35 comprises 500 nm of undoped GaAs. The n-contact layer 33 and the underlying layer 35 are generally formed at temperatures of ~570° C. The substrate temperature is then reduced to 490° C. for the growth of the quantum dot layer.

InAs is deposited in layer 37 overlying underlying layer 35. There is a substantial difference in the lattice constant between InAs and GaAs. This causes layer 37 to form dots. As more InAs is deposited, the size of the dots increases and more dots are formed. The actual growth of the dots will be described in more detail with reference to FIGS. 3 and 4. In this particular example, 0.61 nm of InAs is deposited at an In flux rate of 0.02 μm per hour. After dot layer 37 is grown, the growth is interrupted for approximately 3 minutes.

Strain relaxing layer 39 is then formed overlying and in contact with dot layer 37. Strain relaxing layer 39 comprises 5 nm $In_xGa_{1-x}As$ deposited with an In content of x=0.2 and at an In flux of 0.25 μm/hour. The lattice constant of $In_xGa_{1-x}As$ is larger than that of GaAs but less than that of InAs. The $In_xGa_{1-x}As$ layer thus reduces some of the strain in the quantum dot layer. The indium content in the strain relaxing layer, in conjunction with the growth conditions of the quantum dot layer, is set so as to tune the emission wavelength to the desired value. Taking an In content of x=0.2 achieves an emission wavelength of close to 1300 nm. The dots in dot layer 37 are encapsulated between underlying layer 35 and strain relaxing layer 39.

An undoped layer 41 is then provided overlying and in contact with said strain relaxing layer 39, said undoped layer 41 comprises 200 nm of undoped GaAs. An n type layer 43 comprising 100 nm of n-doped GaAs is then formed overlying and in contact with said GaAs layer 41. Said n-doped layer is doped with $1\times10^{18}$cm$^{-3}$ Si. Finally, the structure is finished with a GaAs capping layer 45 which is formed overlying said n type layer 43.

The substrate temperature during the growth of the dot layer 37 is between 460° C. and 520° C. and is preferably 490° C. The layer immediately above the quantum dot layer, for a thickness of at least 10 nm, should be grown at the same temperature as the quantum dot layer. The remainder of the structure may be grown at the dot growth temperature, or alternatively, the substrate temperature may be increased to 570° C.

The structure basically has a p-i-n form due to p type layer 33 and n type layer 43. These two doped layers 33 and 43 can be used to inject carriers into dot layer 37. This allows carriers to be supplied for recombination as described with reference to FIG. 1.

The base layer defines the lattice constant of the active part of the structure, including the quantum dot layer. In the above example, the GaAs substrate forms the base layer. However, the base layer need not necessarily be defined by the substrate. For example, a thick layer of another material with different lattice constant may be grown on the substrate to act as the base layer. If the base layer is sufficiently thick, the strain is relaxed in the layer and its upper portion will have a different lattice constant to the substrate. The subsequent growth takes place pseudomorphic with the base layer, which acts to define the lattice constant for the remaining structure. For example, a thick InGaAs layer may be grown on the substrate to act as a base layer with larger lattice constant than the GaAs substrate.

Figure 3:
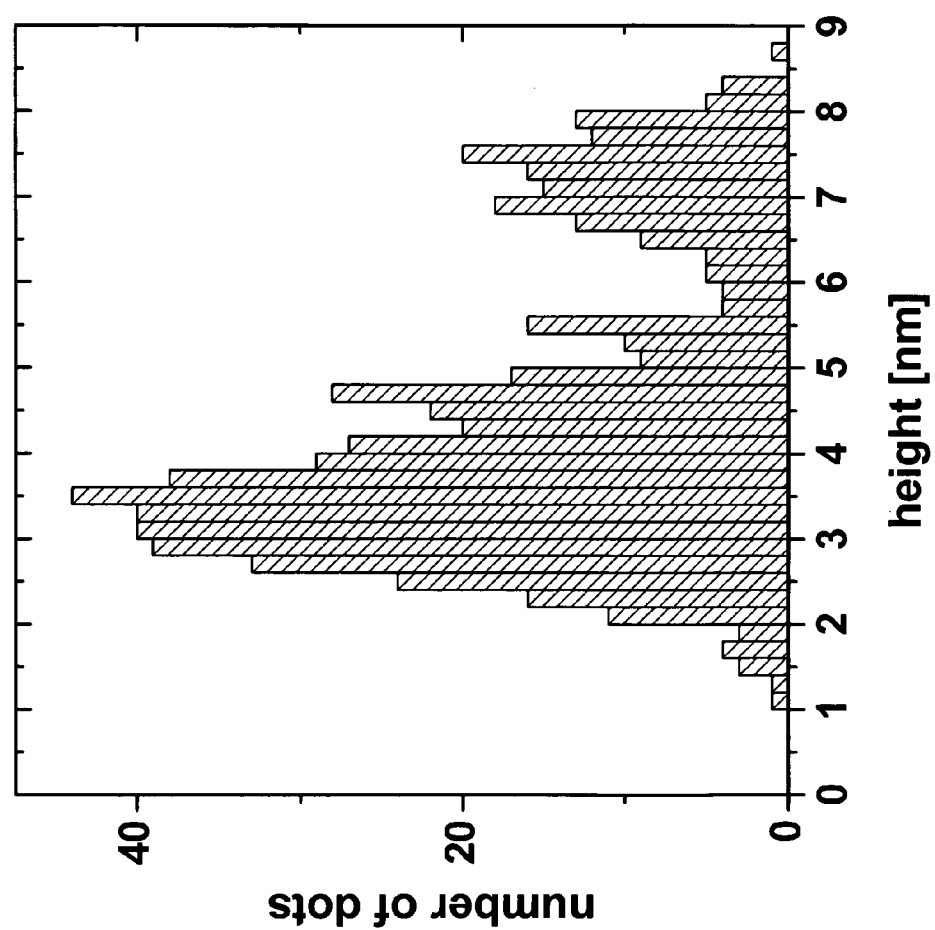
FIG. 3 is a plot of the number of quantum dots formed in a layer in a device similar to that shown in FIG. 2 against height of the quantum dots in nanometers to illustrate a bimodal distribution in the dot size.

FIG. 3 plots the distribution in the heights, measured in an Atomic Force Microscope, of quantum dots grown under similar conditions to those described above, but with the growth terminated after the quantum dot layer. Two peaks are seen in the distribution, a first peak centred around a height of roughly 3.25 nm and a second peak centred around a height of ~7 nm. Thus, the dot distribution is bimodal. For the growth conditions used here, the dots of the second peak are less numerous than the dots of the first peak and are larger in height.

The quantum dot emission wavelength increases with the size of the quantum dot. The quantum dot layer therefore also displays a bimodal distribution its emission wavelength. Dots contribution to the longer wavelength peak of the emission wavelength distribution will have a lower areal density of those of the shorter wavelength peak.

Standard telecom optical fibres have minimum absorption and dispersion for wavelengths close to either 1.3 μm or 1.55 μm. To produce dots which emit this wavelength, it is necessary to use InAs dots which are relatively large and/or with a high indium content. In the bimodal distribution of FIG. 3, dots of the desired wavelength are formed from the longer wavelength peak of the emission wavelength distribution, corresponding to the taller dot peak in FIG. 3 centred around 7 nm.

When producing a single photon source, it is necessary to isolate the output from a single dot or a small number of dots. To produce an N-photon source, the emission from N quantum dots may be isolated. Thus, it is not only desirable to be able to produce dots which emit at the correct wavelength but also to produce a relatively small number of dots at this wavelength in the active region of the device.

The emission wavelength for quantum dots is dictated by a number of factors, for example, the material of the quantum dots, the diameter, height, volume and the shape of the dots. It is also strongly affected by the composition of the barrier materials, for example the strain reducing layer.

Figure 4:
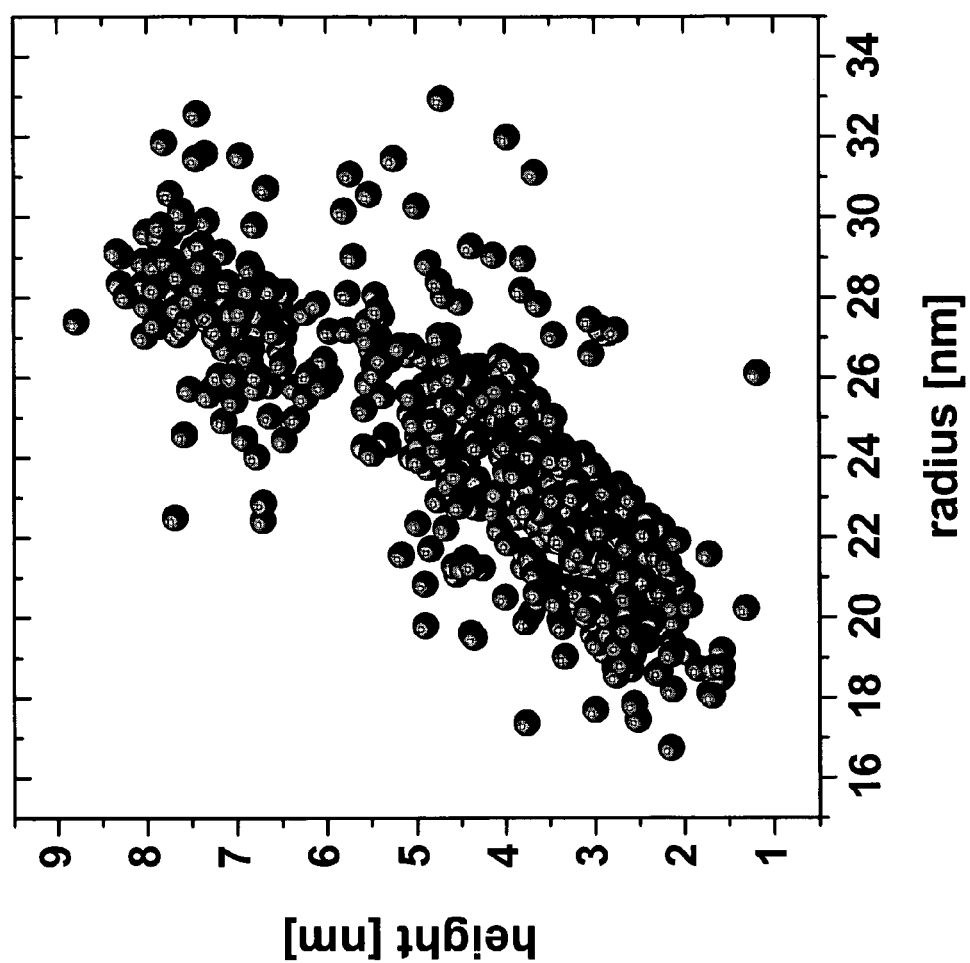
FIG. 4 is a plot of the height of the quantum dots against radius of the quantum dots formed in a structure similar to that described with reference to FIG. 2 to illustrate the correlation in the dot height and radius.

FIG. 4 is a plot of the height of the quantum dots of FIG. 3 against the radius of the quantum dots. Notice that the radius of a quantum dot tends to correlate with its height. A bimodal distribution in the radius is readily apparent, with one group of dots clustered around an average radius of approximately 23 nm and a further larger group of dots clustered around a radius of 28 nm.

Figure 5:
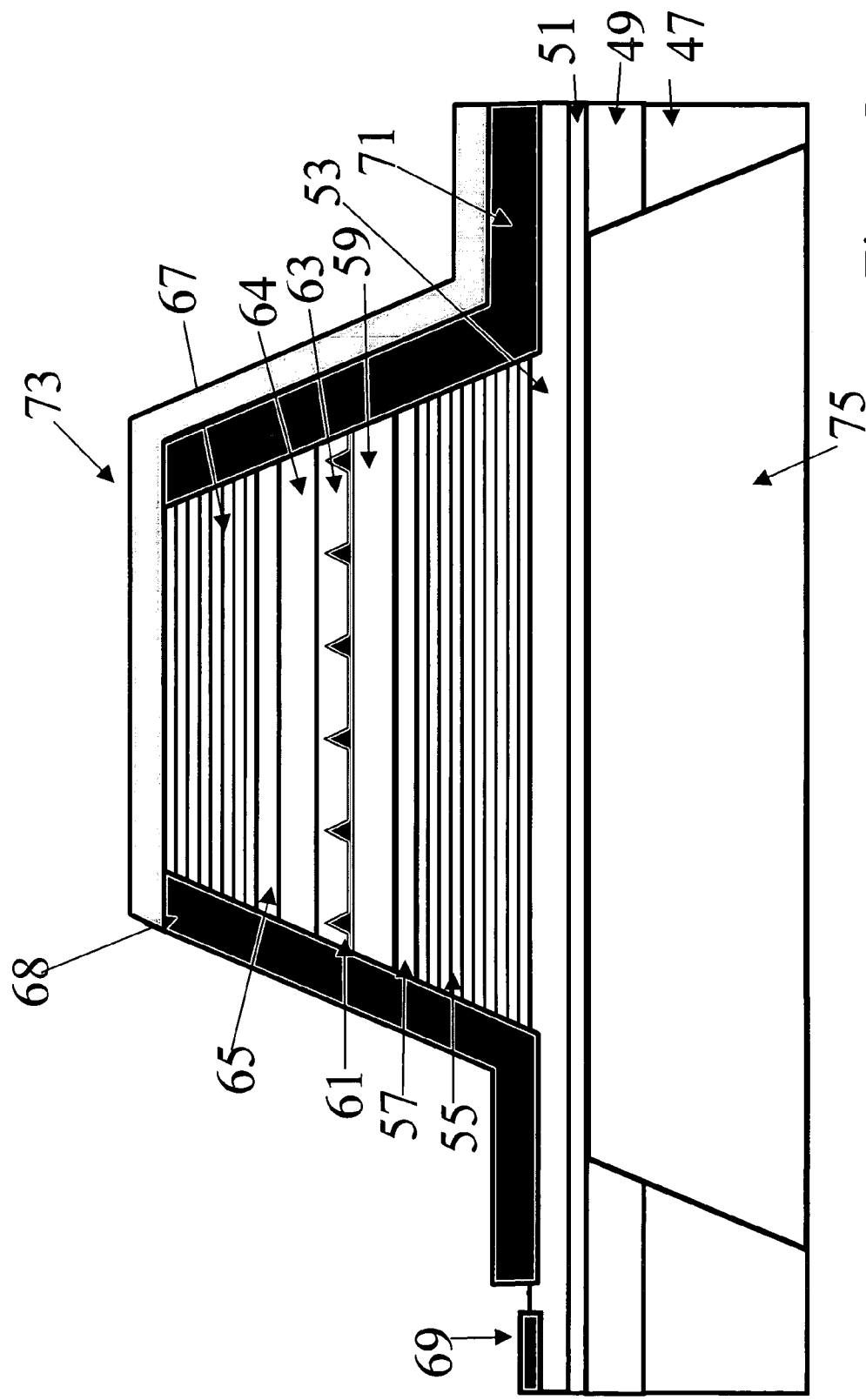
FIG. 5 schematically illustrates an electrically operated photon source comprising a layer of quantum dots grown in accordance with an embodiment of the present invention.

FIG. 5 is a schematic of a further device in accordance with an embodiment of the present invention. The device is formed on semi-insulating GaAs substrate 47. A GaAs buffer layer (49) is used to initialise the growth followed by a 10 nm thick AlAs etch stop layer (51). P type contact layer 53 is provided overlying and in contact with the etch stop layer 51. P type contact layer may be GaAs doped with Beryllium (Be) or Carbon (C) at $5 \times 10^{18}$ cm$^{-3}$. Lower mirror region 55 is then formed overlying and in contact with said p-type contact layer 53. Lower mirror region 55 comprises 15 repeats of alternating layers of GaAs (95.46 nm) and AlAs (110.04 nm). Lower mirror region 55 is also p-type and may be doped with Be or C at $2 \times 10^{18}$ cm$^{-3}$. The AlAs layer may be doped with C and the GaAs layer with Be. A p-type layer (57) is then provided overlying and in contact with the mirror region 55. p-type layer (57) comprises GaAs and is 40.9 nm thick.

Lower cavity layer 59 is then formed overlying and in contact with said p doped layer (57). Lower cavity layer 59 is 150 nm thick and undoped GaAs. Dot layer 61 is then provided overlying said lower cavity layer 59 comprises InAs and is deposited as described with reference to FIGS. 2 to 4. $In_xGa_{1-x}As$ strain relaxing layer is then formed overlying and in contact with said dot layer 61 so that the dots are encapsulated between said strain relaxing layer 63 and the underlying layer 59. $In_xGa_{1-x}As$ strain relaxing layer 63 has an indium content x=0.2 and a thickness of 5 nm.

Upper cavity layer 64 is then formed overlying strain relaxing layer 63. Upper cavity layer is undoped GaAs, 145 nm thick.

n type layer 65 is then formed overlying and in contact with said upper cavity layer 64. n type layer 65 is 40.9 nm thick and comprises GaAs doped n-type with Si at $2 \times 10^{18}$ cm$^{-3}$.

Upper mirror region 67 is formed overlying and in contact with said n-type layer 65. Upper mirror region 67 comprises of 18 repeats of alternating layers of AlAs (110.04 nm) and GaAs (95.46 nm). These layers are n doped with Si: $2 \times 10^{18}$ cm$^{-3}$.

Upper mirror region 67 and lower mirror 55 together define a resonant cavity within which the dot layer 61 resides. The dot layer 61 is preferably provided at an antinode of the cavity. The wavelength of the reflective bands of the mirrors are determined largely by the thicknesses and refractive indices of the mirror layers. The resonant mode of the cavity is set by the refractive index of the layers of the cavity and the space in between lower mirror region 55 and upper mirror region 67. The cavity mode is designed to be resonant with the desired output emission wavelength of the source. Thus, the cavity will block radiation arising from dots other than those emitting at the resonant wavelength and hence provides a wavelength filter. For the above example, the design wavelength of the cavity is 1300 nm.

Using photo- or e-beam lithography, the wafer is patterned and etched through the layers down to p type contact layer 53 to form a small mesa 68. Typically the mesa will have a diameter of 0.5–5 μm. In the case of very small diameter mesas (<2 μm), the thickness of the lower cavity layer 59 and upper cavity layer 64 should be increased, to maintain the desired resonant cavity wavelength.

A metal p type contact 69, such as AuBe, is provided to p-type contact layer 53, using standard techniques.

An n-type contact is made to the top of mesa 68. n type contact metal 73 is provided overlying the structure to make contact to n type mirror region 67. A shallow n-type contact, such as PdGe, can be used to avoid degradation of the upper mirror region. To avoid the p type metal 73 shorting to either the mesa 68 or n type contact layer 53, an insulating layer 71 is provided underlying the p type contact metal 73 where required.

Photons are emitted from the cavity through the substrate side of the device. The GaAs substrate is substantially transparent at the emission wavelength of the quantum dots.

However, the loss due to absorption in the substrate may be reduced by etching a window (75) in the underside of the substrate adjacent to the cavity. A selective etch, which etches GaAs but not AlAs layer may be used to terminate the etched window at the AlAs etch stop layer.

An anti-reflection coating of a dielectric material such as $SiO_2$ may be deposited on the emission surface.

Several variations on this structure are possible.

The emission may be collected from the top of the device. In this case the lower mirror region 55 is arranged to have more repeat periods than the upper mirror region 67. For example the upper mirror region 67 may have 15 repeats and the lower mirror region 55 may have 18 repeats. The n-type contact metal 73 is chosen which is transparent to the emitted photons. For example Indium tin oxide may be used. In this case the n-type contact metal may cover the entire top surface of the mesa.

A reflective n-type contact metal 73 may also be used in conjunction with an emission aperture in said n-type contact metal 73 on top of the mesa 68. The emission aperture defines the active region of the device since radiation can only escape through the aperture due to the n-type metal 73 blocking the remainder of the radiation. This allows again a small area of dots of dot layer 61 to be selected.

Another variation which reduces absorption loss in the lower mirror region 55, is to form the p-type contact to the p-type layer 57. In this case, the mesa etch proceeds through the upper mirror region 67 and through the cavity region (65, 64, 63, 61, 59) but terminates before the p-type region 57. A p-type metal contact is then made to the p-type region 57. In this case the p-type layer 53 may be omitted and the lower mirror region 55 left undoped, or just the upper period of the lower mirror region 55 doped.

Figure 6:
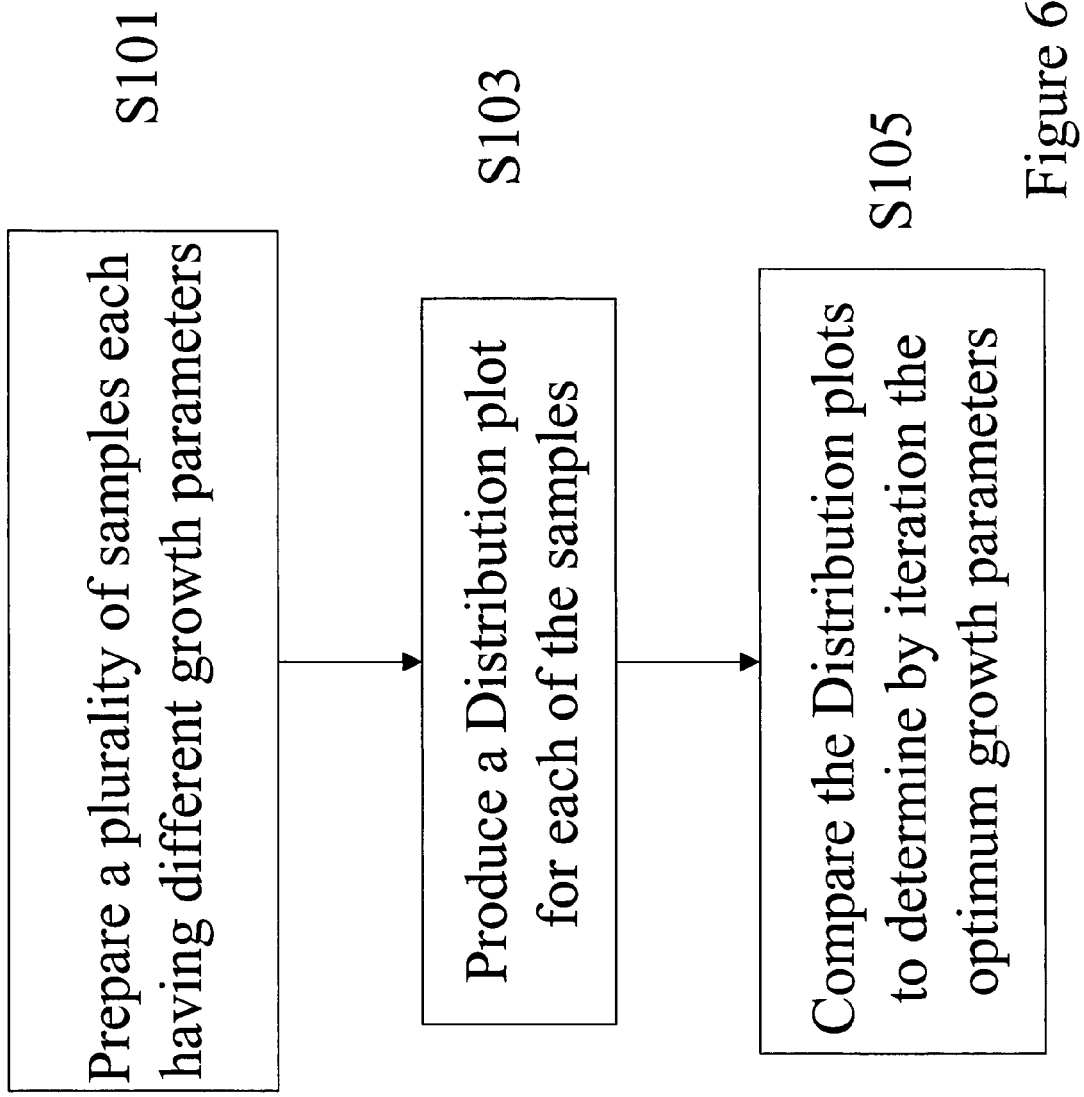
FIG. 6 is a flow diagram schematically illustrating the steps required to optimise the growth parameters for a photon source in accordance with an embodiment of the present invention.

FIG. 6 is a flow diagram of the steps to optimize the growth of the photon source. In step S101, a plurality of samples are prepared, each having different growth parameters. For example, each of the samples will be grown using the same growth temperatures for each of the layers and the same flux for each of the layers. However, the time duration of the growth of the dot layer will be varied for each sample. As the growth duration of the dot layer is increased, the number of dots contributing to the second peak in the emission wavelength distribution will increase.

In step S103, a distribution plot for each of the samples is produced. The distribution plot may be a plot of the number of dots against radius or height of the dots. Alternatively it may be a plot of the distribution of emission wavelengths. Alternatively, a plot of height of dots against radius/area may also be used to illustrate the evidence of bimodal distribution. The distribution plot may be constructed by measuring the dots using photoluminescence or electroluminescence spectroscopy, capacitance spectroscopy, atomic force spectroscopy and transmission electron microscopy. In step S105, the distribution plots produced in step S103 are compared to determine the optimum dot layer thickness which produces the desired dot wavelength with the desired areal density of dots at that wavelength.

In the above example, the growth rate or flux of the material which forms the dots and the growth temperature is kept constant and the thickness of the dot layer is varied. However, it is also possible to vary one or more of these other parameters in order to produce the desired distribution.

The invention claimed is:

1. A photon source comprising a quantum dot layer having a plurality of quantum dots with an n-modal distribution in emission wavelength, said n-modal distribution in emission wavelength comprising n peaks in a plot of dot density as a function of emission wavelength where n is an integer of at least 2, the photon source further comprising isolating means for isolating the emission from a predetermined number of quantum dots.

2. A photon source according to claim 1, wherein the isolating means is configured to isolate emission from dots contributing to the $2^{nd}$ or longer wavelength peak.

3. A photon source according to claim 2, wherein the isolating means is configured to isolate emission from dots from the shorter wavelength side of selected peak.

4. A photon source according to claim 1, wherein n=2 such that the distribution is a bimodal distribution.

5. A photon source according to claim 1, wherein the isolating means are configured to isolate the emission from dots with a predetermined emission wavelength.

6. A photon source according to claim 1, wherein the isolation means are configured to isolate output from dots with an emission wavelength of 1.3 µm or 1.55 µm.

7. A photon source according to claim 1, wherein the quantum dots are provided within a quantum well.

8. A photon source according to claim 1, further comprising a base layer, wherein said quantum dot layer is composed of a material which when unstrained has a different lattice constant to that of said base layer.

9. A photon source according to claim 8, further comprising a strain relaxing layer composed of a material which when unstrained has a different lattice constant to that of the dot layer and the base layer.

10. A photon source according to claim 9, wherein said strain relaxing layer is provided adjacent the dot layer.

11. A photon source according to claim 1, further comprising electrical supply means to electrically supply carriers to the quantum dots to allow emission of photons.

12. A photon source according to claim 11, wherein said electrical supply means are configured to supply carriers to a predetermined number of dots.

13. A photon source according to claim 1, further comprising a radiation source configured to excite carriers within said quantum dots.

14. A photon source according to claim 1, comprising at least one barrier layer configured such that there is a difference of at least 0.1 eV in the conduction and valence band between the dot layer and said at least one barrier layer.

15. A photon source according to claim 14, wherein said dot layers comprise In and said at least one barrier layer comprises Al.

16. A photon source according to claim 1, wherein said dot layer is provided within a cavity.

17. A photon source according to claim 16, said cavity is configured to allow the emission of photons having said predetermined wavelength.

18. A photon source according to claim 1, wherein said dot layer comprises a density of at most $4 \times 10^8$ dots per $cm^2$ with the desired emission wavelength.

19. A photon source according to claim 1, having an emissive area of less than $10^{-10}$ $m^2$.

20. A photon source according to claim 19, having an emissive area of less than $10^{-12}$ $m^2$.

21. A method of fabricating a photon source, the method comprising:

forming a base layer having a first lattice constant;

forming a layer of quantum dots by depositing material having a different lattice constant to said base layer when the layers are unstrained, said material being deposited until the dots formed have an n-modal population distribution with respect to emission wavelength, said n-modal distribution in emission wavelength comprises n-peaks in a plot of dot density as a function of emission wavelength, where n is an integer of at least two.

22. A method of fabricating a photon source according to claim 21, wherein the amount of material deposited to form said dot layer is controlled to be close to or slightly greater than the amount required for the transition between dots which contribute to the first peak and dots which contribute to the second peak in the distribution.

23. A method according to either of claim 21 wherein n=2 such that the distribution is a bimodal distribution.

* * * * *